United States Patent
Kulkarni et al.

(10) Patent No.: US 10,228,735 B2
(45) Date of Patent: Mar. 12, 2019

(54) METHODS OF DIRECT COOLING OF PACKAGED DEVICES AND STRUCTURES FORMED THEREBY

(71) Applicant: Intel Corporation, Santa Clara, CA (US)

(72) Inventors: Devdatta P. Kulkarni, Portland, OR (US); Richard J. Dischler, Bolton, MA (US); Je-Young Chang, Phoenix, AZ (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 15/637,439

(22) Filed: Jun. 29, 2017

(65) Prior Publication Data
US 2019/0004573 A1    Jan. 3, 2019

(51) Int. Cl.
*G06F 1/20* (2006.01)
*H01L 21/02* (2006.01)
*H01L 23/367* (2006.01)
*H01L 23/495* (2006.01)

(52) U.S. Cl.
CPC .......... *G06F 1/20* (2013.01); *H01L 21/02225* (2013.01); *H01L 23/3672* (2013.01); *H01L 23/49568* (2013.01); *G06F 2200/201* (2013.01)

(58) Field of Classification Search
CPC . G06F 1/20; G06F 2200/201; H05K 7/20218; H05K 7/20254; H05K 7/20927; H01L 21/02225; H01L 23/3672; H01L 23/473; H01L 23/49568

USPC .. 361/699, 701–702, 760, 761, 764, 679.47; 257/714, 722; 165/80.4–80.5, 104.33
See application file for complete search history.

(56) References Cited

U.S. PATENT DOCUMENTS

| | | | |
|---|---|---|---|
| 5,291,064 A * | 3/1994 | Kurokawa | H01L 23/057 257/706 |
| 5,345,107 A * | 9/1994 | Daikoku | F28F 13/00 165/185 |
| 5,705,850 A * | 1/1998 | Ashiwake | H01L 23/4338 257/706 |
| 5,801,442 A * | 9/1998 | Hamilton | H01L 23/473 257/712 |
| 6,317,326 B1 * | 11/2001 | Vogel | H01L 23/473 165/80.4 |
| 7,849,914 B2 * | 12/2010 | Di Stefano | H01L 23/473 165/46 |
| 9,653,378 B2 * | 5/2017 | Hou | H01L 23/473 |
| 2004/0061218 A1 * | 4/2004 | Tilton | F28D 5/00 257/710 |

(Continued)

*Primary Examiner* — Dion Ferguson
*Assistant Examiner* — Amir A Jalali
(74) *Attorney, Agent, or Firm* — Green, Howard & Mughal LLP.

(57) ABSTRACT

Methods of forming microelectronic package structures/modules, and structures formed thereby, are described. Structures formed herein may include a die disposed on a substrate; a cooling solution comprising a first surface and a second surface opposite the first surface, wherein the second surface is disposed on a backside of the die disposed on a package substrate. A lid comprising an outer surface is disposed on the first surface of the cooling solution, wherein the lid includes a plurality of fins disposed on an inner surface of the lid. A solder is disposed between the outer surface of the lid and the first surface of the cooling solution.

25 Claims, 6 Drawing Sheets

(56) References Cited

U.S. PATENT DOCUMENTS

| | | | |
|---|---|---|---|
| 2005/0068725 A1* | 3/2005 | Houle | H01L 21/4878 361/688 |
| 2005/0146021 A1* | 7/2005 | Edwards | H01L 23/36 257/704 |
| 2010/0039777 A1* | 2/2010 | Houle | H01L 23/24 361/718 |
| 2013/0299133 A1* | 11/2013 | Li | H01L 24/81 165/80.3 |
| 2017/0229377 A1* | 8/2017 | Ellsworth, Jr. | H01L 23/473 |

* cited by examiner

METHODS OF DIRECT COOLING OF PACKAGED DEVICES AND STRUCTURES FORMED THEREBY

BACKGROUND

Ever increasing power requirements for packaged microelectronic devices require aggressive cooling techniques. Typical fin and fan cooling structures can become prohibitively large, and may provide inefficient airflow stream with which to support the cooling demands of high power packaged devices. Data centers using servers, for example, may require liquid pumping of cooling structures to cool high wattage devices within the microelectronic packages of such server systems.

BRIEF DESCRIPTION OF THE DRAWINGS

While the specification concludes with claims particularly pointing out and distinctly claiming certain embodiments, the advantages of these embodiments can be more readily ascertained from the following description when read in conjunction with the accompanying drawings in which:

DETAILED DESCRIPTION

Figure 1:
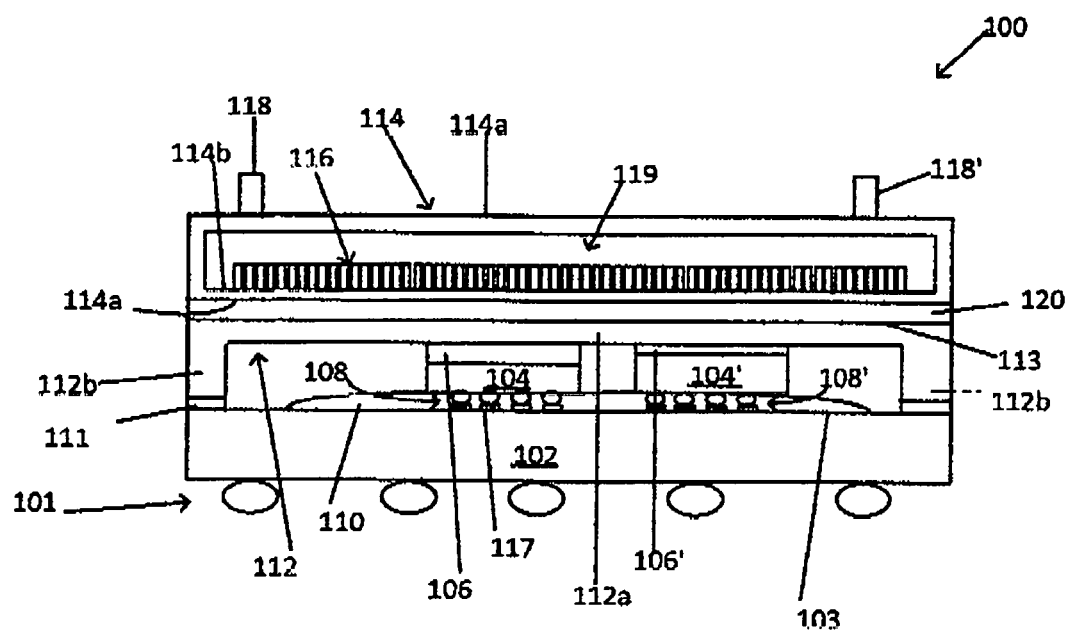
FIG. 1 represents a cross-sectional view of structures according to embodiments.

In the following detailed description, reference is made to the accompanying drawings that show, by way of illustration, specific embodiments in which the methods and structures may be practiced. These embodiments are described in sufficient detail to enable those skilled in the art to practice the embodiments. It is to be understood that the various embodiments, although different, are not necessarily mutually exclusive. For example, a particular feature, structure, or characteristic described herein, in connection with one embodiment, may be implemented within other embodiments without departing from the spirit and scope of the embodiments. In addition, it is to be understood that the location or arrangement of individual elements within each disclosed embodiment may be modified without departing from the spirit and scope of the embodiments.

The following detailed description is, therefore, not to be taken in a limiting sense, and the scope of the embodiments is defined only by the appended claims, appropriately interpreted, along with the full range of equivalents to which the claims are entitled. In the drawings, like numerals may refer to the same or similar functionality throughout the several views. The terms "over", "to", "between" and "on" as used herein may refer to a relative position of one layer with respect to other layers. One layer "over" or "on" another layer or bonded "to" another layer may be directly in contact with the other layer or may have one or more intervening layers. One layer "between" layers may be directly in contact with the layers or may have one or more intervening layers. Layers and/or structures "adjacent" to one another may or may not have intervening structures/layers between them. A layer(s)/structure(s) that is/are directly on/directly in contact with another layer(s)/structure(s) may have no intervening layer(s)/structure(s) between them.

Various implementations of the embodiments herein may be formed or carried out on a substrate, such as a package substrate. A package substrate may comprise any suitable type of substrate capable of providing electrical communications between an electrical component, such a an integrated circuit (IC) die, and a next-level component to which an IC package may be coupled (e.g., a circuit board). In another embodiment, the substrate may comprise any suitable type of substrate capable of providing electrical communication between an IC die and an upper IC package coupled with a lower IC/die package, and in a further embodiment a substrate may comprise any suitable type of substrate capable of providing electrical communication between an upper IC package and a next-level component to which an IC package is coupled.

A substrate may also provide structural support for a die. By way of example, in one embodiment, a substrate may comprise a multi-layer substrate—including alternating layers of a dielectric material and metal—built-up around a core layer (either a dielectric or a metal core). In another embodiment, a substrate may comprise a coreless multi-layer substrate. Other types of substrates and substrate materials may also find use with the disclosed embodiments (e.g., ceramics, sapphire, glass, etc.). Further, according to one embodiment, a substrate may comprise alternating layers of dielectric material and metal that are built-up over a die itself—this process is sometimes referred to as a "bumpless build-up process." Where such an approach is utilized, conductive interconnects may or may not be needed (as the build-up layers may be disposed directly over a die, in some cases).

A die may include a front-side and an opposing back-side. In some embodiments, the front-side may be referred to as the "active surface" of the die, and may comprise active and passive devices, for example. A number of interconnects may extend from the die's front-side to the underlying substrate, and these interconnects may electrically couple the die and substrate. In some cases a die may be directly coupled to a board, such as a motherboard. Interconnects/traces may comprise any type of structure and materials capable of providing electrical communication between a die and substrate/board. In one embodiment, a die may be disposed on a substrate in a flip-chip arrangement. In an embodiment interconnects comprise an electrically conductive terminal on a die (e.g., a pad, bump, stud bump, column, pillar, or other suitable structure or combination of structures) and a corresponding electrically conductive terminal on the substrate (e.g., a pad, bump, stud bump, column, pillar, or other suitable structure or combination of structures).

Solder (e.g., in the form of balls or bumps) may be disposed on the terminals of the substrate and/or die, and these terminals may then be joined using a solder reflow process. Of course, it should be understood that many other types of interconnects and materials are possible (e.g., wirebonds extending between a die and substrate). In some embodiments herein, a die may be coupled with a substrate by a number of interconnects in a flip-chip arrangement. However, in other embodiments, alternative structures and/or methods may be utilized to couple a die with a substrate.

Embodiments of methods of forming packaging structures, including methods of providing cooling for package structures, such as those including high power microelectronic devices, are described. Those structures formed thereby may include a die disposed on a substrate; a cooling solution comprising a first surface and a second surface opposite the first surface, wherein the second surface is disposed on a backside of the die disposed on a substrate. A lid comprising an outer surface is disposed on the second surface of the cooling solution, wherein the lid includes a plurality of fins disposed on an inner surface of the lid. A solder is disposed between the outer surface of the lid and the first surface of the cooling solution. The embodiments herein enable improved thermal performance in liquid and/or air cooled systems, by eliminating the thermal interface material (TIM) between a cooling solution and a lid.

The Figures herein illustrate embodiments of fabricating package structures/modules comprising a cooling solution including a lid with microchannel structures. In an embodiment, an integrated heat spreader (IHS), may be fabricated to include an integrated liquid and/or air cooling structure/lid, wherein the use of a TIM material between the cooling solution and the lid is eliminated. The package structure may comprise ball grid array packages, or socket packages, in embodiments. FIG. 1a depicts a cross-sectional view of a package structure 100 that may be fabricated according to embodiments included herein. In an embodiment, the package structure 100 may comprise multiple die, and may comprise a multichip package structure 100. The package structure 100 may comprise a substrate 102, which may comprise any suitable substrate 102 that may be utilized to attach at least one device/die thereto, as well as incorporating passive components thereon, in some cases. Interconnect structures 101 may be disposed on a bottom surface of the substrate 102, and may serve to electrically and physically couple the substrate 102 to a board, such as a mainboard/printed circuit board, for example.

In an embodiment, a first die 104 and a second die 104' may be disposed on a top surface 103 of the substrate 102. The first die 104 and the second die 104' may be disposed adjacent one another on the top surface 103 of the substrate 102, and in some embodiments, may comprise different Z-heights from each other. The first and second die 104, 104' may comprise any type of microelectronic device/functionality, including devices such as a microprocessor, a graphics processor, a signal processor, a network processor, a chipset, memory devices, platform controller hub (PCH), DRAM memory, graphics processing unit (GPU) and/or field programmable gate array (FPGA) devices, for example, and may include wireless devices. In an embodiment, the package structure 100 may comprises any number of die attached to the substrate 102, and may comprise portions of a server system.

In an embodiment, the die 104, 104' may each comprise a system on a chip (SOC) having multiple functional units (e.g., one or more processing units, one or more graphics units, one or more communications units, one or more signal processing units, one or more security units, etc.). In an embodiment, the die 104, 104' may comprise a portion of a high power system, wherein the die/devices may require over 200 Watts of power, or even greater than 300 Watts, in some cases. However, it should be understood that the disclosed embodiments are not limited to any particular type or class of die/devices.

In an embodiment, the die 104, 104' may comprise an active side and an opposing back side, wherein a TIM material 106, 106' may be disposed on each of the backsides of the die 104, 104' respectively. The active sides of the die 104, 104' may be disposed on the substrate 102. An underfill material 110 may be disposed around/on solder interconnect structures 108, 108' that may be disposed between contact structures 117 disposed on the top surface 103 of the substrate 102 and the die 104, 104'.

A cooling solution 112 may be disposed on/over the die 104, 104' and on/over the substrate 102. The cooling solution 112 may comprise any suitable cooling solution and may comprise any suitable thermally conductive materials, and may have any suitable shape or structure. According to one embodiment, the cooling solution 112 may comprise an integrated heat spreader (IHS). Materials that may be used to construct the cooling solution 112 include metals (e.g., copper and alloys thereof), thermally conductive composites, and thermally conductive polymers. In one embodiment, a wetting layer (e.g., nickel) or other coating may be disposed over at least a portion of the cooling solution's surface. In an embodiment, the cooling solution 112 does not include microchannels/fins.

In an embodiment, the cooling solution/structure 112 may comprise a planar portion 112a and support structures 112b. The support structures 112b may be disposed on the top surface 103 of the substrate 102. The support structures that may be attached/bonded to the substrate 102 by a sealant material 111, such as an epoxy adhesive, silicone, and other suitable materials.

In an embodiment, a lid 114 may be disposed on a top/first surface 113 of the cooling solution 112. The lid 114 may comprise any suitable type of cooling structure, and may comprise a cover, a direct liquid micro jet lid, or a heat sink, for example. The lid 114 may comprise a multi-fin (or multi-pin) heat sink secured over/on the cooling solution 112 and die by a solder material 120, in an embodiment. The lid 114 may comprise an inner surface 114b and an outer surface 114a.

A plurality of fins 116 may be disposed on the inner surface 114b of the lid 114, and may be disposed within a chamber 119 within the lid 114. The plurality of fins 116 may comprise a plurality of microchannels 116, in an embodiment. The fins/microchannels 116 may be comprised of any suitable material, and may comprise similar materials as the lid 114, in an embodiment. The microchannels 116 may comprise a plurality of thin walls/grooves, and may be capable of receiving a fluid, such as a cooling fluid, from an inlet port, such as inlet port 118. The microchannels 116 are capable of delivering fluid to an outlet port, such as outlet port 118', for example. The surface walls of the microchannels provide surface area that may act as cooling fins.

In an embodiment, the lid 114 may be operated in a single phase mode, wherein liquid only or gas only is provided, or by using both liquid and gas in a two phase cooling mode. In some embodiments, the cooling fluid is water, in other embodiments, the fluid may be a refrigerant, alcohol, inert fluorinated hydrocarbon, helium, and/or other suitable cooling fluid (either liquid or gas). The lid 114 may be thermally coupled with the cooling solution 112 of the embodiments by use of a solder material/layer 120, that may be disposed between the top surface 113 of the cooling solution 112 and the outer surface 114a of the lid 114. The solder 120 may comprise such materials as high thermal conductivity, low melting point solders, and may extend across an entire length of the top surface 113 of the cooling solution 112. The lid 114 may not require a lid retention mechanism to be attached to the substrate 102, since the solder 120 may be sufficient to bond the lid 114 to the cooling solution 112. Thus, thermal resistance is reduced for the package structure 100 by eliminating the use of a highly variable and resistive TIM, such as a polymer TIM between the cooling solution and the lid, as in prior art lid attachment schemes. For example, a typical prior art TIM may comprise a variation in thickness across a cooling solution, and may comprise a thermal resistance of between about 0.05-0.06 degrees Celsius per Watt. In some cases, temperature differences across a prior art TIM for die exceeding 200 W may be about 10 to about 12 degrees Celsius. Low melting point solder utilized in the embodiments herein eliminate TIM resistance between the lid and cooling solution. Prior art TIM materials between the lid 114 and the cooling solution 112 may comprise a thermal conductivity of less than about 14 W/mK, for example, but may be much less than the solder 120 (which may comprise a thermal conductivity of greater than about 15 W/mK) utilized in the embodiments herein.

Figure 2A:
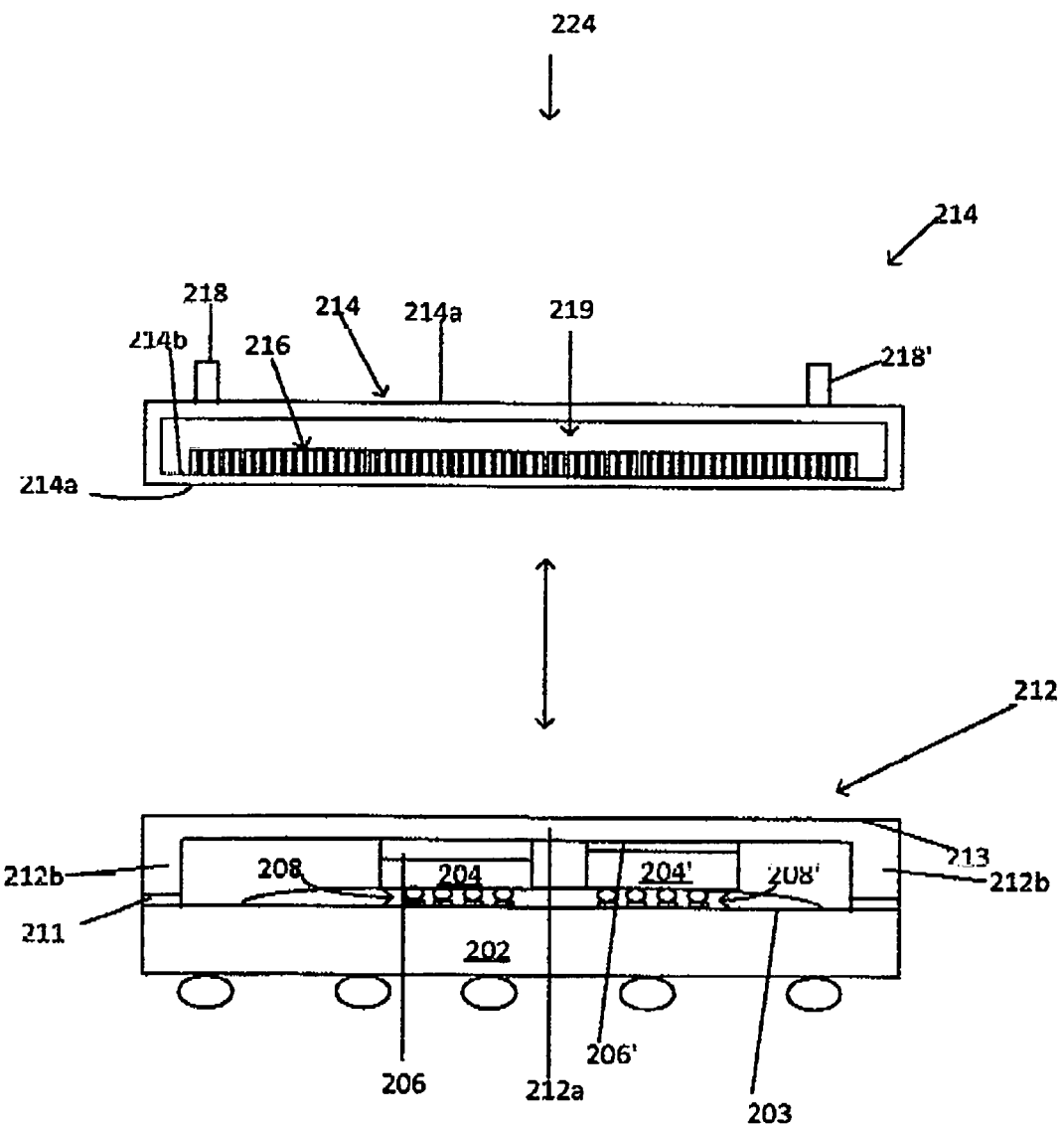
FIGS. 2a-2b represent cross-sectional views of structures formed according to methods of forming package structures according to embodiments.
Figure 2B:
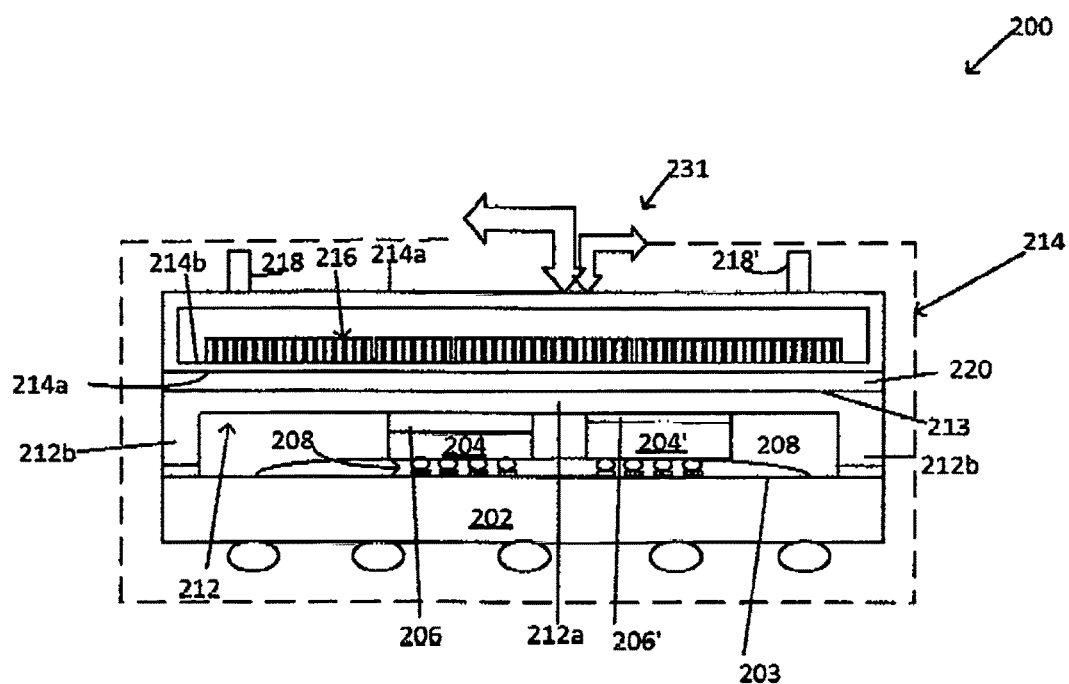

FIGS. 2a-2b depict cross sectional views of a method of forming a package structure 200, such as package structure 100 of FIG. 1, for example. In FIG. 2a, a lid 214 may be provided, wherein the lid 214 may comprise a cover or a heat sink, for example. By way of example, the lid 214 may comprise a multi-fin (or multi-pin) heat sink. The lid 214 may comprise an inner surface 214b and an outer surface 214a. A plurality of fins 216 may be disposed on the inner surface 214b of the lid 214, and may be disposed within a chamber 219 of the lid 214. The plurality of fins 216 may comprise a plurality of microchannels 216, in an embodiment. The microchannels 216 may comprise a plurality of thin vertical walls, and may be capable of receiving a fluid, such as a cooling fluid, from an inlet port, such as inlet port 218. The microchannels are capable of delivering fluid to an outlet port, such as outlet port 218', for example.

A cooling solution 212 may be provided. In an embodiment, the cooling solution 212 may be disposed on a package substrate 202, but in other embodiments, the cooling solution 212 alone may be provided. In an embodiment, a first die 204 and a second die 204' may be disposed on a top surface 203 of the substrate 202. Solder interconnect structures 208, 208' may be disposed between the die 204, 204' respectively, and the substrate 202. In an embodiment, the solder interconnect structures may comprise first level interconnect structures (FLI).

In some embodiments, the first and second die 204, 204' may comprise different Z-heights from each other, while in other embodiments, their Z-heights may be similar to each other. A first thermal interface material (TIM) 206 may be disposed on a backside of the first die 204, and a second TIM 206' may be disposed on the backside of the second die 204', and in some embodiments, the thicknesses of the TIM 206, 206' may comprise different heights from each other, while in other embodiments, the thickness of the TIM 206, 206' may be similar. The TIM 206, 206' may comprise a material that serves to provide thermal conductivity between the die 204, 204' and the cooling solution 212. In an embodiment, the TIM material may comprise a polymer material, or any other suitable material depending upon the particular design requirements.

The TIM 206, 206' may serve to thermally couple the die 204, 204' with the cooling solution 212, and may comprise any suitable thermally conductive material capable of forming a thermally conductive (and perhaps mechanical) bond between the backsides of the die 204, 204' and a cooling solution. For example, the TIM material may comprise a solder material, a composite material, a thermally conductive polymer, as well as any combination of these and/or other materials.

In one embodiment, a central, planar portion 212a of the cooling solution 212 may be disposed on the first and second die 204, 204', and may be disposed on a surface of the first and second TIM 206, 206', in an embodiment. The support portions 212b of the cooling solution 212 may be disposed on the edges/peripheral portions of the substrate 202, and may be bonded to the peripheral portion of the substrate 202 with a sealant 211, such as an epoxy material, for example. In an embodiment, a bonding process 224 may be applied, wherein an outer surface 214a of the lid 214 may be bonded to the top surface 213 of the cooling solution 212.

A bonding process 224 may comprise a solder process for example, but may comprise other processes which serve to bond the lid 214 to the cooling solution 212, without the use of a retention mechanism coupled to the substrate 202. In an embodiment, the bonding process 224 may comprise soldering the lid 214 to the cooling solution 112 using such solder materials such as tin solder, or any suitable low melting point solder materials. The bonding process 224 may occur at between about 50 degrees Celsius to about 250 degree Celsius, for example, and may be performed in a temperature range that is greater than a reflow temperature of the selected solder material, in some embodiments. In an embodiment, the solder material 220 may comprise a thermal conductivity of greater than about 15 W/m-K and may comprise a thickness of between about 10 microns to about 300 microns, in some embodiments. In an embodiment, the bonding process 224 may comprise utilizing any suitable non-solder materials with which to bond the cooling solution to the lid.

In an embodiment, a cooling flow 231 may be capable of circulating around the die 204, 204' within the package 200, and may be achieved by the flow of air and/or liquid across the package 200 that is generated by the lid 214 FIG. 2b. In an embodiment, high power devices and applications, such as server applications, may be cooled using the methods/structures of the embodiments herein.

The various embodiments of the package assemblies/interconnect structures herein describe the fabrication of various cooling structures for high powered devices, such as those comprising 300 watts and beyond, such as may be used in server applications, for example. In some cases, enhanced server density is enabled by supplying fluid through the lid according to the embodiments, which may remove heat from the rear of a server rack, for example. The fluid cooling of the package in the embodiments provided allow devices, such as silicon devices, to cool, reduce electrical leakage, and maintain steady low temperatures that result in higher reliability for silicon, solder packages, and thermo-compression bonds, without the need for a TIM between the cooling solution and the lid.

For processors whose central processing unit (CPU) die power may exceed 200 W, every degree reduction in CPU temperature may translate into high gain for the processor and its related increased performance. The microchannels in the lid described herein provide liquid flow on top of heat spreaders/cooling solutions, while allowing traditional test and validation methods to be performed. The cooling by the lid maintains structural integrity and stresses on TIM between die on the substrate. The embodiments herein can be used for both socketed or BGA processors with different loading requirements, and can be employed with bare die as well as with fluid directly touching silicon dies.

Applications include data center, automotive devices, high power FPGA devices, or in any computing device to achieve exascale computing performance. By attaching an external microchannel grooved lid on top of an existing IHS of a processor, for example, high thermal performance technology is achieved. Thermal performance is superior than traditional liquid cooled solutions using cold plates, for example, due to the elimination of TIM2 material in the thermal stack up. The embodiments do not require a separate IHS for implementation of direct liquid cooling at the IHS level. The embodiments enable superior thermal solutions for 300 W and greater multi chip packages, for example.

Figure 3:
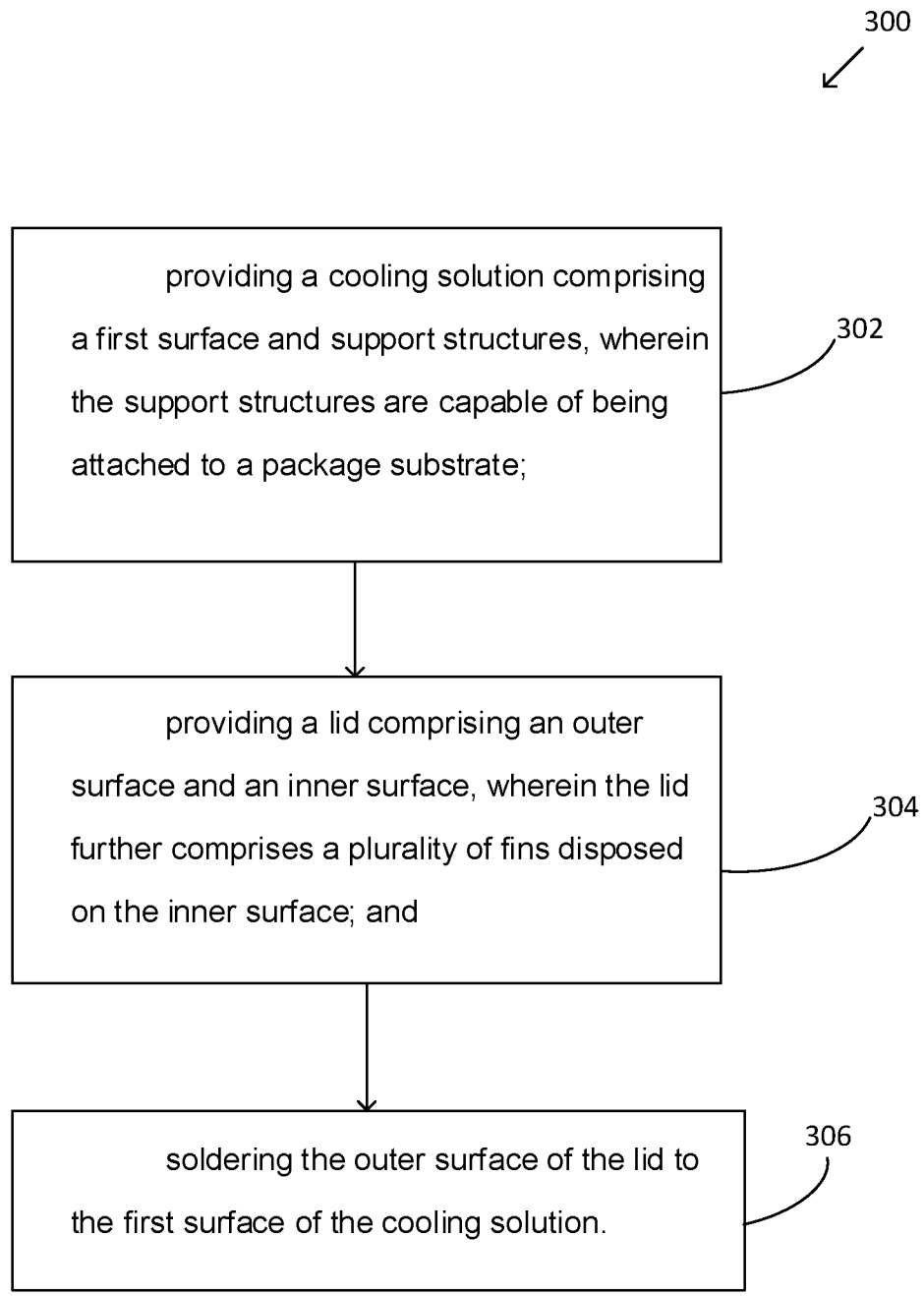
FIG. 3 represents a flowchart of a method of forming package structures according to embodiments.

FIG. 3 depicts a method 300 of forming a package structure according to embodiments herein. At step 302, a cooling solution may be provided comprising a first surface and support structures, wherein the support structures are capable of being attached to a package substrate. The cooling solution may comprise a heat spreader, such as an integrated heat spreader, for example, and may be free of fins. At step 304, a lid may be provided comprising an outer surface and an inner surface, wherein the lid further comprises a plurality of fins disposed on the inner surface. In an embodiment, the lid may comprise a plurality of microchannel grooves on an inner surface of an IHS, for example. The microchannels can be fabricated using any suitable manufacturing techniques.

At step 306, the outer surface of the lid may be soldered to the first surface of the cooling solution. In an embodiment, the lid may be soldered to the cooling solution with a low melting point solder material. In another embodiment, the cooling solution may be placed on a package structure, such as a multichip package structure, prior to soldering the lid to the cooling solution. The solder may comprise any suitable solder material, however since the lid is soldered/bonded onto the cooling solution, a TIM is not required between the cooling solution and the lid. Superior thermal properties are achieved by eliminating TIM2 resistance, in an embodiment.

The structures of the embodiments herein may be coupled with any suitable type of structures capable of providing electrical communications between a microelectronic device, such as a die, disposed in package structures, and a next-level component to which the package structures may be coupled (e.g., a circuit board). The device/package structures, and the components thereof, of the embodiments herein may comprise circuitry elements such as logic circuitry for use in a processor die, for example. Metallization layers and insulating material may be included in the structures herein, as well as conductive contacts/bumps that may couple metal layers/interconnects to external devices/layers. In some embodiments the structures may further comprise a plurality of dies, which may be stacked upon one another, depending upon the particular embodiment. In an embodiment, the die(s) may be partially or fully embedded in a package structure.

The various embodiments of the package structures included herein may be used for system on a chip (SOC) products, and may find application in such devices as smart phones, notebooks, tablets, wearable devices and other electronic mobile devices. In various implementations, the package structures may be included in a laptop, a netbook, an ultrabook, a personal digital assistant (PDA), an ultra-mobile PC, a mobile phone, a desktop computer, a server, a printer, a scanner, a monitor, a set-top box, an entertainment control unit, a digital camera, a portable music player, or a digital video recorder, and wearable devices. In further implementations, the package devices herein may be included in any other electronic devices that process data.

Figure 4:
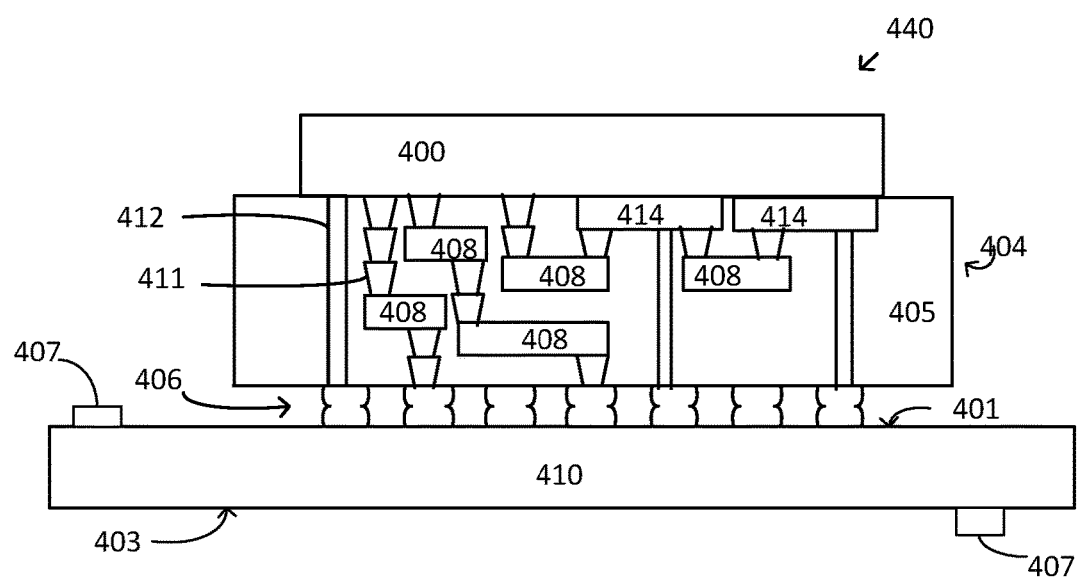
FIG. 4 represents a cross section of a portion of a computing system according to embodiments.

Turning now to FIG. 4, illustrated is a cross sectional view of an embodiment of a computing system 440. The system 440 includes any number of components disposed on a mainboard 410 or other circuit board. Mainboard 410 includes a first side 401 and an opposing second side 403, and various components 407, such as passive components including inductors and resistors, for example, may be disposed on either one or both of the first and second sides 401, 403.

In the illustrated embodiment, the computing system 440 includes a package structure 400 disposed on the mainboard's first side 401, wherein the package structure 400 may comprise any of the package structures described herein according to embodiments, such as the package structure 100 of FIG. 1, for example. The package structure 400 may include a cooling solution disposed on a backside of at least one die of the package structure 400, wherein the cooling solution is soldered to a lid, as in the embodiments herein, such as those described in FIG. 1, for example. System 440 may comprise any type of computing system, such as, for example, a hand-held or mobile computing device (e.g., a cell phone, a smart phone, a mobile internet device, a music player, a tablet computer, a laptop computer, a nettop computer, etc.). However, the disclosed embodiments are not limited to hand-held and other mobile computing devices and these embodiments may find application in other types of computing systems, such as desk-top computers and servers.

Mainboard 410 may comprise any suitable type of circuit board or other substrate capable of providing electrical communication between one or more of the various components disposed on the board. In one embodiment, for example, the mainboard 410 comprises a printed circuit board (PCB). However, it should be understood that the disclosed embodiments are not limited to the above-described PCB and, further, that mainboard 410 may comprise any other suitable substrate.

In an embodiment, a substrate 404, such as an interposer, for example, may be disposed between the package structure 400 and the board 410, and may be physically and electrically coupled with the board by interconnect structures 406. The substrate 404 may comprise multiple metal layers 408, such as layers 408 that may be electrically coupled with vias 411, wherein the metal layers may be separated from one another by a layer(s) of dielectric material, such as dielectric layer 405. The substrate 404 may further comprise conductive through hole vias 412 and conductive pads 414 disposed on one or more surfaces of the substrate 404.

In an embodiment, any one or more of the conductive structures 412, 408, 411, 414 may be formed in a desired circuit pattern to route—perhaps in conjunction with other metal layers—electrical signals between the package structure 400 and the board 410. In another embodiment, the package structure 400 may be directly attached/electrically and physically coupled to the mainboard 410, by a substrate included within the package structure 440, such as the substrate 102 of FIG. 1, for example, and wherein the substrate 102 may comprise the same or similar elements as the substrate 404.

The additional components 407 may include other IC devices (e.g., processing devices, memory devices, signal processing devices, wireless communication devices, graphics controllers and/or drivers, audio processors and/or controllers, etc.), power delivery components (e.g., a voltage regulator and/or other power management devices, a power supply such as a battery, and/or passive devices such as a capacitor), and one or more user interface devices (e.g., an audio input device, an audio output device, a keypad or other data entry device such as a touch screen display, and/or a graphics display, etc.), as well as any combination of these and/or other devices. In one embodiment, the computing system 440 includes a radiation shield.

In another embodiment, the computing system 440 includes an antenna. In yet a further embodiment, the assembly 440 may be disposed within a housing or case. Where the mainboard 410 is disposed within a housing, some of the components of computer system 440—e.g., a user interface device, such as a display or keypad, and/or a power supply, such as a battery—may be electrically coupled with the mainboard 410 (and/or a component disposed on this board) but may or may not be mechanically coupled with the housing.

Figure 5:
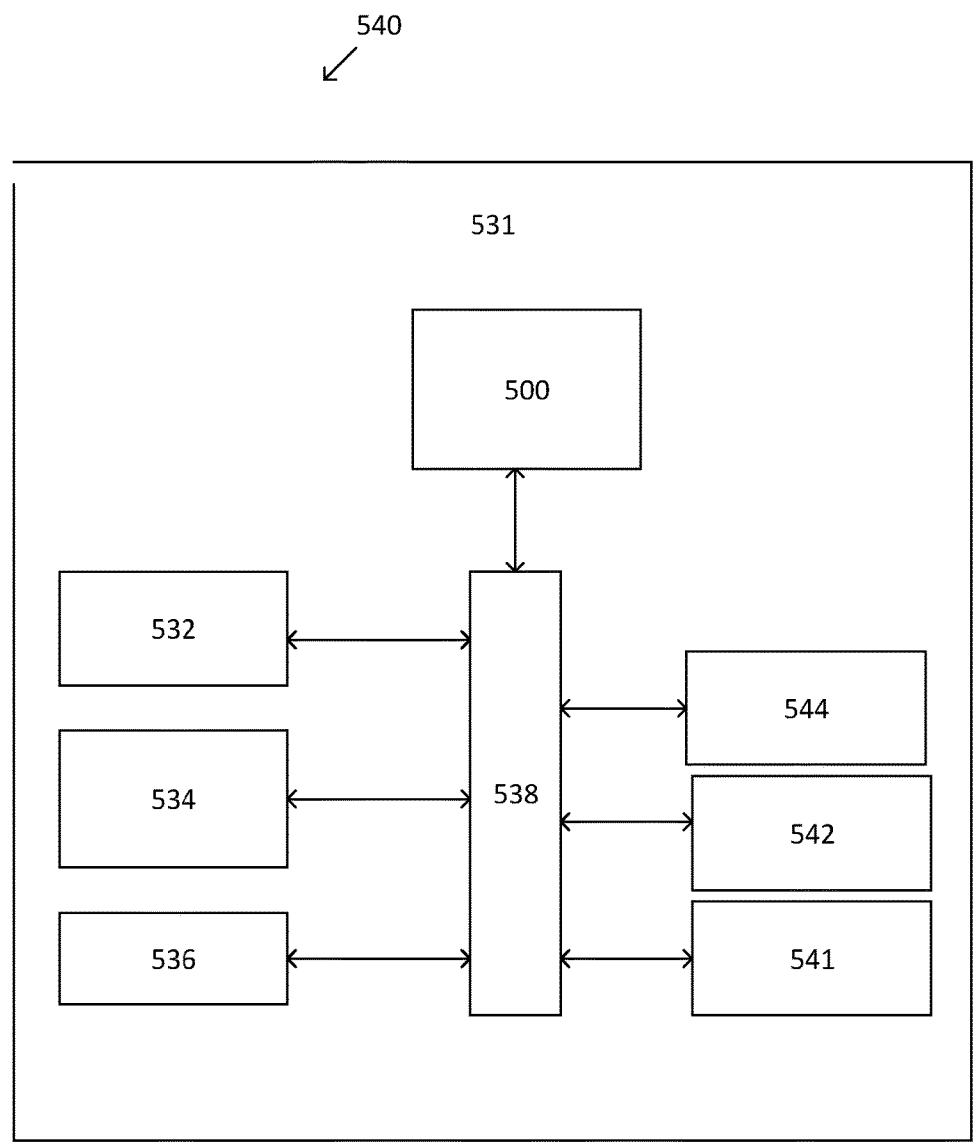
FIG. 5 represents a schematic of a computing system according to embodiments.

Turning now to FIG. 5, illustrated is a schematic of an embodiment of a portion of a computing system 540, including one or more of the package structures 500, fabricated according to any of the embodiments of the package structures included herein, such as package structure 100 of FIG. 1. The package structure 500 may include any or all of the elements of the embodiments included herein as a part of the system 540.

In some embodiments, the system 540 includes a processing means such as one or more processors 532 coupled to one or more buses or interconnects, shown in general as bus 538. The processors 532 may comprise one or more physical processors and one or more logical processors. In some embodiments, the processors may include one or more general-purpose processors or special-processor processors.

The bus 538 may be a communication means for transmission of data. The bus 538 may be a single bus for shown for simplicity, but may represent multiple different interconnects or buses and the component connections to such interconnects or buses may vary. The bus 538 shown in FIG. 5 is an abstraction that represents any one or more separate physical buses, point-to-point connections, or both connected by appropriate bridges, adapters, or controllers. In some embodiments, the system 540 further comprises a random access memory (RAM) or other dynamic storage device or element as a main memory 534 for storing information and instructions to be executed by the processors 532. Main memory 534 may include, but is not limited to, dynamic random access memory (DRAM). The system 540 also may comprise one or more passive devices 536, such as capacitors and inductors that may be installed on a board, such as a printed circuit board 531.

In some embodiments, the system 540 includes one or more transmitters or receivers 541 coupled to the bus 538. In some embodiments, the system 440 may include one or more antennae 544 (internal or external), such as dipole or monopole antennae, for the transmission and reception of data via wireless communication using a wireless transmitter, receiver, or both, and one or more ports 542 for the transmission and reception of data via wired communications. Wireless communication includes, but is not limited to, Wi-Fi, Bluetooth™, near field communication, and other wireless communication standards. In an embodiment an antenna may be included in the module 500.

System 540 may comprise any type of computing system, such as, for example, a hand-held or mobile computing device (e.g., a cell phone, a smart phone, a mobile internet device, a music player, a tablet computer, a laptop computer, a nettop computer, etc.). However, the disclosed embodiments are not limited to hand-held and other mobile computing devices and these embodiments may find application in other types of computing systems, such as desk-top computers and servers.

EXAMPLES

Example 1 is a microelectronic package structure comprising: a die disposed on a substrate; a cooling solution comprising a first surface and a second surface opposite the first surface, wherein the second surface is disposed on a backside of the die; a lid comprising an outer surface and an inner surface, wherein the outer surface is disposed on the first surface of the cooling solution, and wherein the lid includes a plurality of fins disposed on the inner first surface of the lid; and a solder disposed between the outer surface of the lid and the first surface of the cooling solution.

Example 2 includes the microelectronic package structure of example 1 wherein the cooling solution comprises an integrated heat spreader.

Example 3 includes the microelectronic package structure of any of examples 1-2 wherein a second die is disposed adjacent the first die on the substrate.

Example 4 includes the microelectronic package structure of any of the examples 1-3 wherein the lid comprises a heat sink.

Example 5 includes the microelectronic package structure of any of examples 1-4 wherein the lid comprises an inlet port and an outlet port on the outer surface.

Example 6 includes the microelectronic package structure of example any of the examples 1-5 wherein the lid comprises a direct liquid micro jet lid.

Example 7 includes the microelectronic package structure of any of the examples 1-6 wherein the plurality of fins comprises a plurality of microchannels.

Example 8 includes the microelectronic package structure of any of the examples 1-7 wherein the package comprises an operating power rating of at least 200 Watts.

Example 9 is a computing system comprising: a system board; a memory connected to the system board; a package coupled to the memory through the system board, the package including a plurality of die on the substrate, a cooling solution comprising a first surface and a second surface opposite the first surface, wherein the second surface is disposed on a backside of the die; a lid comprising an outer surface and an inner surface, wherein the outer surface is disposed on the first surface of the cooling solution, and wherein the lid includes a plurality of fins disposed on the inner first surface of the lid; and a solder directly disposed between the outer surface of the lid and the first surface of the cooling solution.

Example 10 includes the computing system of example 9 wherein the solder comprises a thickness of between about 10 to about 300 microns.

Example 11 includes the computing system of any of the examples 9-10 wherein the thermal conductivity of the solder is greater than about 15 W/mK.

Example 12 includes the computing system of any of the examples claim 9-11 wherein the system comprises a server system.

Example 13 includes the computing system of any of the examples 9-12 wherein the plurality of fins comprises a plurality of microchannels.

Example 14 includes the computing system of any of the examples 9-13 wherein the first surface of the cooling solution is free of a thermal interface material.

Example 15 includes the computing system of any of the examples 9-14 wherein the package comprises an operating power of greater than about 200 W.

Example 16 includes the computing system of any of the examples 9-15, wherein the substrate is free of a lid retention structure.

Example 17 is a method of forming a microelectronic package structure comprising: providing a cooling solution comprising a first surface and support structures, wherein the support structures are capable of being attached to a package substrate; providing a lid comprising an outer surface and an inner surface, wherein the lid further comprises a plurality of fins disposed on the inner surface; and soldering the outer surface of the lid to the first surface of the cooling solution.

Example 18 includes the method of example 17 further comprising attaching a second surface of the cooling solution to a backside of a die, wherein the die is disposed on a package substrate, and further attaching the support structures to the package substrate.

Example 19 includes the method of example 18 wherein the package substrate comprises a plurality of die disposed on the substrate.

Example 20 includes the method of claim any of examples 18-19 wherein a first die and a second die are disposed on the package substrate, and wherein the first die and the second die comprise different Z-heights from each other.

Example 21 includes the method of any of examples 18-20 wherein the package substrate is free of a lid retention mechanism.

Example 22 includes the method of any of examples 17-21 wherein the outer surface of the lid is free of a thermal interface material.

Example 23 includes the method of any of examples 17-22 wherein the lid further comprises an inlet port and an outlet port.

Example 24 includes the method of any of the examples 17-23 further comprising flowing a fluid through the inlet and outlet ports to cool the package structure.

Example 25 includes the method of any of claims 17-24 further comprising attaching the second surface of the cooling solution to a backside of a die disposed on a package structure prior to soldering the lid to the first surface of the cooling solution.

Example 26 includes the computing system of any of the examples 9-16, wherein the lid comprises a heat sink.

Example 27 includes the computing system of any of the examples 9-16, wherein the lid is capable of flowing a fluid through the microchannels.

Example 28 includes the computing system of any of the examples 9-16, wherein the lid comprises a single or a two phase cooling system.

Example 29 includes the computing system of any of the examples 9-16, wherein the package comprises a socket package.

Example 30 includes the computing system of any of the examples 9-16, wherein the lid comprises a ball grid array package.

Although the foregoing description has specified certain steps and materials that may be used in the methods of the embodiments, those skilled in the art will appreciate that many modifications and substitutions may be made. Accordingly, it is intended that all such modifications, alterations, substitutions and additions be considered to fall within the spirit and scope of the embodiments as defined by the appended claims. In addition, the Figures provided herein illustrate only portions of exemplary microelectronic devices and associated package structures that pertain to the practice of the embodiments. Thus, the embodiments are not limited to the structures described herein.

What is claimed is:

1. A microelectronic package structure comprising:
    a die on a substrate;
    a cooling solution comprising a first surface and a second surface opposite the first surface, wherein the second surface is on a backside of the die;
    a lid comprising an outer surface and an inner surface, wherein the outer surface is on the first surface of the cooling solution, and wherein the lid includes a plurality of fins on the inner surface of the lid; and
    a solder between the outer surface of the lid and the first surface of the cooling solution, wherein the solder is on an entire length of the first surface of the cooling solution.

2. The microelectronic package structure of claim 1 wherein the cooling solution comprises an integrated heat spreader.

3. The microelectronic package structure of claim 1 wherein a second die is adjacent the first die on the substrate.

4. The microelectronic package structure of claim 1 wherein the lid comprises a heat sink.

5. The microelectronic package structure of claim 1 wherein the lid comprises an inlet and an outlet port on the outer surface, and wherein the outer surface of the lid is over the entire length of the first surface of the cooling solution.

6. The microelectronic package structure of claim 5 wherein the lid comprises a direct liquid micro jet lid.

7. The microelectronic package structure of claim 6 wherein the plurality of fins comprises a plurality of microchannels.

8. The microelectronic package structure of claim 7 wherein the die comprises an operating power of at least 200 watts.

9. A computing system comprising:
    a system board;
    a memory connected to the system board;
    a package coupled to the memory through the system board, the package including a plurality of die on a substrate, a cooling solution comprising a first surface and a second surface opposite the first surface, wherein the second surface is on a backside of the die;
    a lid comprising an outer surface and an inner surface, wherein the outer surface is on the first surface of the cooling solution, and wherein the lid includes a plurality of fins on the inner first surface of the lid; and
    a solder directly between the outer surface of the lid and the first surface of the cooling solution, wherein the solder is on an entire length of the first surface of the cooling solution.

10. The computing system of claim 9 wherein the solder comprises a thickness of between 10 to 300 microns.

11. The computing system of claim 9 wherein the thermal conductivity of the solder is greater than 15 W/mK.

12. The computing system of claim 9 wherein the system comprises a server system.

13. The computing system of claim 9 wherein the plurality of fins comprises a plurality of microchannels.

14. The computing system of claim 9 wherein the first surface of the cooling solution is free of a thermal interface material.

15. The computing system of claim 9 wherein the die comprises an operating power of greater than 200 W.

16. The computing system of claim 9, wherein the substrate is free of a lid retention structure.

17. A method of forming a microelectronic package structure comprising:
    providing a cooling solution comprising a first surface and support structures, wherein the support structures are capable of being attached to a package substrate;
    providing a lid comprising an outer surface and an inner surface, wherein the lid further comprises a plurality of fins on the inner surface;
    forming a solder on an entire length of the first surface of the cooling solution;

attaching the outer surface of the lid to the first surface of the cooling solution; and attaching a second surface of the cooling solution to a backside of a die.

18. The method of claim 17 wherein the die is on a package substrate, and further comprising attaching the support structures to the package substrate.

19. The method of claim 18 wherein the package substrate comprises a plurality of die.

20. The method of claim 18 wherein a first die and a second die are on the package substrate, and wherein the first die and the second die comprise different heights from each other.

21. The method of claim 18 wherein the package substrate is free of a lid retention mechanism.

22. The method of claim 18 wherein the outer surface of the lid is free of a thermal interface material.

23. The method of claim 18 wherein the lid further comprises an inlet port and an outlet port.

24. The method of claim 23 further comprising flowing a fluid through the inlet and the outlet port of the lid to cool the package structure.

25. The method of claim 17 wherein the lid comprises a direct liquid micro jet lid.

* * * * *